United States Patent
Sekiguchi

(10) Patent No.: US 6,233,040 B1
(45) Date of Patent: *May 15, 2001

(54) EXPOSURE APPARATUS WITH SETTING OF STAGE DRIVING IN ACCORDANCE WITH TYPE OF MOTION OF STAGE AND DEVICE MANUFACTURING METHOD

(75) Inventor: Hiroyuki Sekiguchi, Utsunomiya (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/099,147

(22) Filed: Jun. 18, 1998

(30) Foreign Application Priority Data

Jun. 24, 1997 (JP) ..................................... 9-181894

(51) Int. Cl.$^7$ ........................... G03B 27/42; G03B 27/60; G01B 11/00
(52) U.S. Cl. ................................ 355/53; 355/77; 356/401
(58) Field of Search ................................ 355/53, 67, 55, 355/77, 68, 69; 250/205; 356/400, 399, 401

(56) References Cited

U.S. PATENT DOCUMENTS 5,784,166 * 7/1998 Sogard .................................. 356/400
5,838,443 * 11/1998 Sekiguchi ............................. 356/401

* cited by examiner

*Primary Examiner*—Russell Adams
*Assistant Examiner*—Peter B Kim
(74) *Attorney, Agent, or Firm*—Fitzpatrick, Cella, Harper & Scinto

(57) ABSTRACT

In order to obtain a high throughput without degrading superposition alignment, an exposure device for performing exposure to a substrate on a substrate stage while moving and positioning the substrate stage includes a setting unit which can set the value of a drive parameter for driving the substrate stage as different values depending on the types of movement of the substrate stage. The setting unit can set the value of the drive parameter in movement to alignment measurement shots, the value of the drive parameter in scanning exposure, the value of the drive parameter in another movement, and the like as values which are different from each other, and sets the highest velocity or/and the maximum acceleration in movement to alignment measurement shots to be lower than the highest velocity or/and the maximum acceleration in another movement.

24 Claims, 7 Drawing Sheets

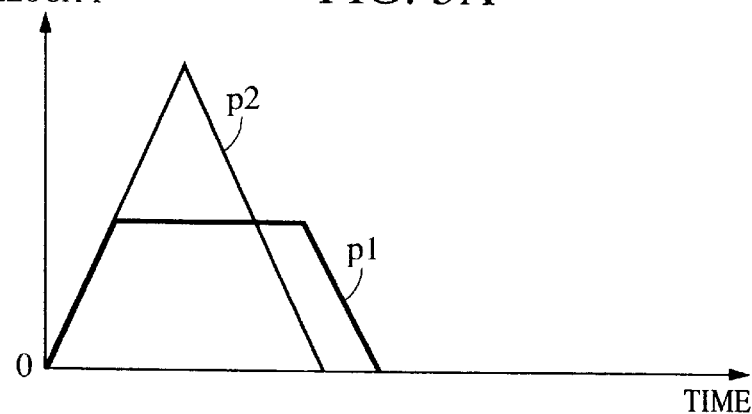
FIG. 5A
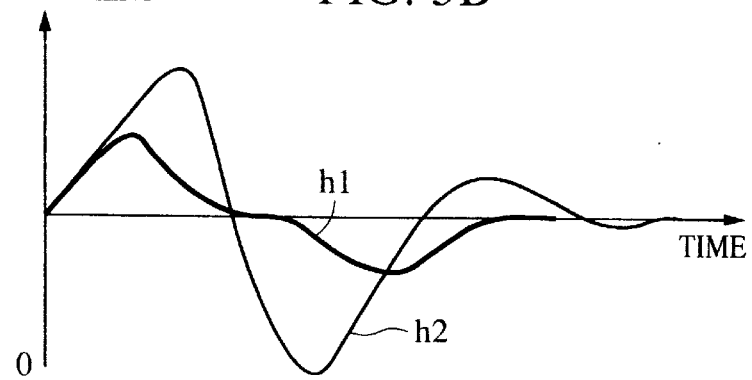
FIG. 5B
FIG. 6
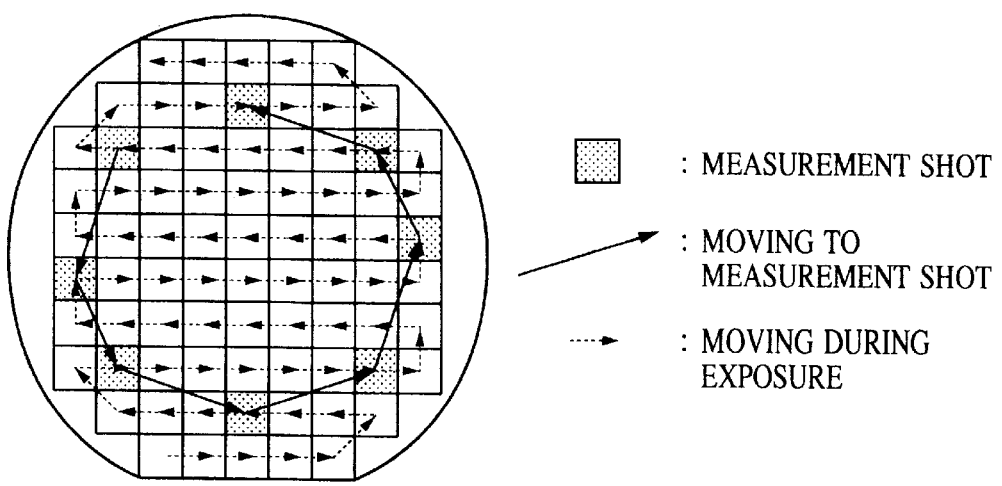

EXPOSURE APPARATUS WITH SETTING OF STAGE DRIVING IN ACCORDANCE WITH TYPE OF MOTION OF STAGE AND DEVICE MANUFACTURING METHOD

BACKGROUND OF THE INVENTION

1. Field of the Invention

The present invention relates to an exposure apparatus for manufacturing a semiconductor integrated circuit and a device manufacturing method which can use the exposure device and, more particularly, to improvement of driving of a substrate stage on which a substrate such as a wafer two-dimensionally moves in an exposure reference plane.

2. Description of the Related Art

In the lithography process in manufacturing a semiconductor integrated circuit, a reduction-projection type exposure device using a step-and-repeat scheme, i.e., a so-called stepper is popularly used. FIG. 7 shows the arrangement of the stepper. Referring to FIG. 7, reference numeral 71 denotes a wafer; 72, an X stage constituting a wafer stage; 73, a Y stage constituting a wafer stage; 74, an X-stage drive linear motor; 75, a Y-stage drive linear motor; 76, a measurement mirror; 77, an X-stage position measurement laser beam; 78, a Y-stage position measurement laser beam; 79, an X-stage position measurement laser interferometer; 80, a Y-stage position measurement laser interferometer; 81, a reduction-projection lens; and 82, a reticle. This device also comprises a light source for ultraviolet rays, X-rays, or the like (not shown).

In such a semiconductor reduction exposure device, a micropattern drawn on the reticle 82 is reduced to ⅕ by the reduction-projection lens 81 by means of a light source for ultraviolet rays, X-rays, or the like to expose and transfer the reduced pattern onto the wafer 71. At this time, the wafer 71 is sequentially exposed while an X-Y drive called step-and-repeat is repeated by the X and Y wafer stages 72 and 73. This X-Y drive depends on a position measured by the laser interferometers 79 and 80 to drive linear motors 74 and 75, thereby positioning the wafer stages 72 and 73.

FIG. 4 shows a conventional drive method for a wafer stage in the X-Y drive. The abscissa indicates time, and the ordinate indicates a velocity. Reference symbols S1 to S4 denote lines representing the difference between velocity patterns caused by the difference between stage moving amounts. The line S1 having a small stage moving amount represents a velocity pattern in which, after the stage is maximally accelerated, the maximum deceleration is performed, such that the velocity does not reach the highest velocity V1, to move the stage to a target position. In contrast to this, the line S4 having a larger stage moving amount represents a pattern in which a stage is maximally accelerated to the highest velocity V1, constant-velocity movement at the highest velocity V1 is performed, and maximum deceleration is performed to move the stage to a target position.

As basic performances required in the stepper shown in FIG. 7, superposition precision and throughput are known. The wafer stage is an important mechanism which affects the performances. The positioning precision of the wafer stage considerably influences the superposition precision, and the drive time of the wafer stage considerably influences the throughput.

The drive time and positioning precision of the wafer stage are conflicting elements, and it is considerably difficult to improve both performances, i.e., both the drive time and the positioning precision. More specifically, increases in maximum acceleration and highest velocity of the velocity pattern of the wafer stage largely contribute to shortening of drive time. However, when the maximum acceleration and the highest velocity are increased, the amplitude of vibration of the stepper body serving as a base for supporting the wafer stage increases. The vibration serves as a disturbance to degrade the positioning precision of the wafer stage. For example, as shown in FIG. 5A, the drive time of a velocity pattern p2 is shorter than the drive time of a velocity pattern p1 such that the highest velocity of the velocity pattern p2 is increased. However, as shown in corresponding FIG. 5B, the amplitude of vibration of the body increases because a body displacement h2 in the velocity pattern p2 is larger than a body displacement h1 in the velocity pattern p1. In particular, residual vibration upon completion of the drive operates as a disturbance in positioning to cause degradation of the positioning precision.

For this reason, the maximum acceleration and the highest velocity of the velocity pattern of the wafer stage in a conventional stepper are set to satisfy the highest superposition precision required in the stepper, and these acceleration and velocity are fixed.

SUMMARY OF THE INVENTION

In a semiconductor exposure apparatus having a global alignment function, wafer stage precision in alignment measurement is very important. This is because a positioning error of the wafer stage in alignment measurement influences superposition precision of all shots in a wafer in exposure.

As shown in FIG. 6, the moving distance of the wafer stage in alignment measurement is longer than the moving distance in exposure. For this reason, the positioning precision of the wafer stage is influenced by the highest velocity or the maximum acceleration of the wafer stage more easily in exposure than in alignment measurement.

More specifically, since the maximum acceleration and the highest velocity of the wafer stage are constant in the above conventional art, when the maximum acceleration and the highest velocity of the wafer stage are increased to increase throughput, the wafer stage precision in alignment measurement is degraded, and the superposition precision of all the shots are degraded.

It is an object of the present invention to provide an exposure device which can obtain a high throughput without degrading superposition precision, and a device manufacturing method which can use the exposure device.

In order to achieve the object, according to the present invention, an exposure device for performing exposure to a substrate on a substrate stage while moving and positioning the substrate stage is characterized by comprising setting means for setting the value of a drive parameter for driving the substrate stage as different values depending on the types of movement of the substrate stage.

According to this arrangement, the value of the drive parameter is appropriately set according to the difference of demands for the positioning precision and the throughput depending on the types of movement of the substrate stage, so that the positioning precision and the throughput can be made compatible with each other.

In a preferred embodiment of the present invention, an exposure device has a global alignment function, and the setting means can set the value of a drive parameter in movement to alignment measurement shots and the value of a drive parameter in another movement as different values.

For example, the drive parameter corresponds to the highest velocity or the maximum acceleration of the substrate stage.

The setting means sets the highest velocity or/and the maximum acceleration in movement to alignment measurement shots to be lower than the highest velocity or/and the maximum acceleration in another movement (i.e., a movement other than movement to alignment movement shots), respectively. In addition, when the exposure device is a scanning exposure device, the setting means can set the value of a drive parameter in movement to alignment shots, the value of a drive parameter in scanning exposure, and the value of a drive parameter in the remaining movement (i.e., a movement other than (a) movement to alignment shots and (b) scanning exposure) as values which are different from each other.

As described above, the highest velocity and the maximum acceleration in alignment measurement which considerably influence positioning precision are set to be lower values to give priority to the positioning precision, and the highest velocity and the maximum acceleration in exposure or another movement which slightly influence the positioning precision are set to be higher values to give priority to throughput, so that the maximum throughput within the range of precision required in the exposure device can be obtained without degrading the positioning precision in alignment measurement or the like.

In view of the foregoing, in one aspect, the present invention relates to an exposure apparatus having a global alignment function for performing exposure to a substrate on a substrate stage while moving and positioning the substrate stage, the device comprising (a) driving means for driving the substrate stage in accordance with a drive parameter, and (b) setting means for setting a value of the drive parameter to a first value in movement to alignment measurement shots and to a second value different from the first value in movement other than movement to alignment measurement shots.

In another aspect, the present invention relates to a device manufacturing method for performing exposure to a substrate on a substrate stage while moving and positioning the substrate stage, the method comprising the step of setting the value of a drive parameter for driving the substrate stage to different values in accordance with the type of movement of the substrate stage.

In yet another aspect, the present invention relates to an exposure apparatus, comprising a control circuit for controlling driving of a substrate stage in accordance with at least one of a maximum permitted stage velocity and a maximum permitted stage acceleration, wherein when the control circuit controls driving of the substrate stage in accordance with the maximum permitted stage velocity, the control circuit sets the maximum permitted stage velocity to a lower value in the case of substrate stage movement to alignment shots than in the case of substrate stage movement other than movement to alignment shots, and wherein when the control circuit controls driving of the substrate stage in accordance with the maximum permitted stage acceleration, the control circuit sets the maximum permitted stage acceleration to a lower value in the case of substrate stage movement to alignment shots than in the case of substrate stage movement other than movement to alignment shots.

In still another aspect, the present invention relates to a substrate stage driving method, comprising the step of controlling driving of a substrate stage in accordance with at least one of a maximum permitted stage velocity and a maximum permitted stage acceleration, wherein when the controlling step controls driving of the substrate stage in accordance with the maximum permitted stage velocity, the controlling step sets the maximum permitted stage velocity to a lower value in the case of substrate stage movement to alignment shots than in the case of substrate stage movement other than movement to alignment shots, and wherein when the controlling step controls driving of the substrate stage in accordance with the maximum permitted stage acceleration, the controlling step sets the maximum permitted stage acceleration to a lower value in the case of substrate stage movement to alignment shots than in the case of substrate stage movement other than movement to alignment shots.

These and other aspects, objects, advantages, and features of the present invention will become apparent from the following detailed description of preferred embodiments thereof taken in connection with the accompanying drawings.

BRIEF DESCRIPTION OF THE DRAWINGS

FIGS. 5A and 5B are graphs showing the relationship between velocity patterns and body displacement.

FIG. 6 is a view showing movement to measurement shots of global alignment and movement in exposure.

DESCRIPTION OF THE PREFERRED EMBODIMENTS

Figure 1:
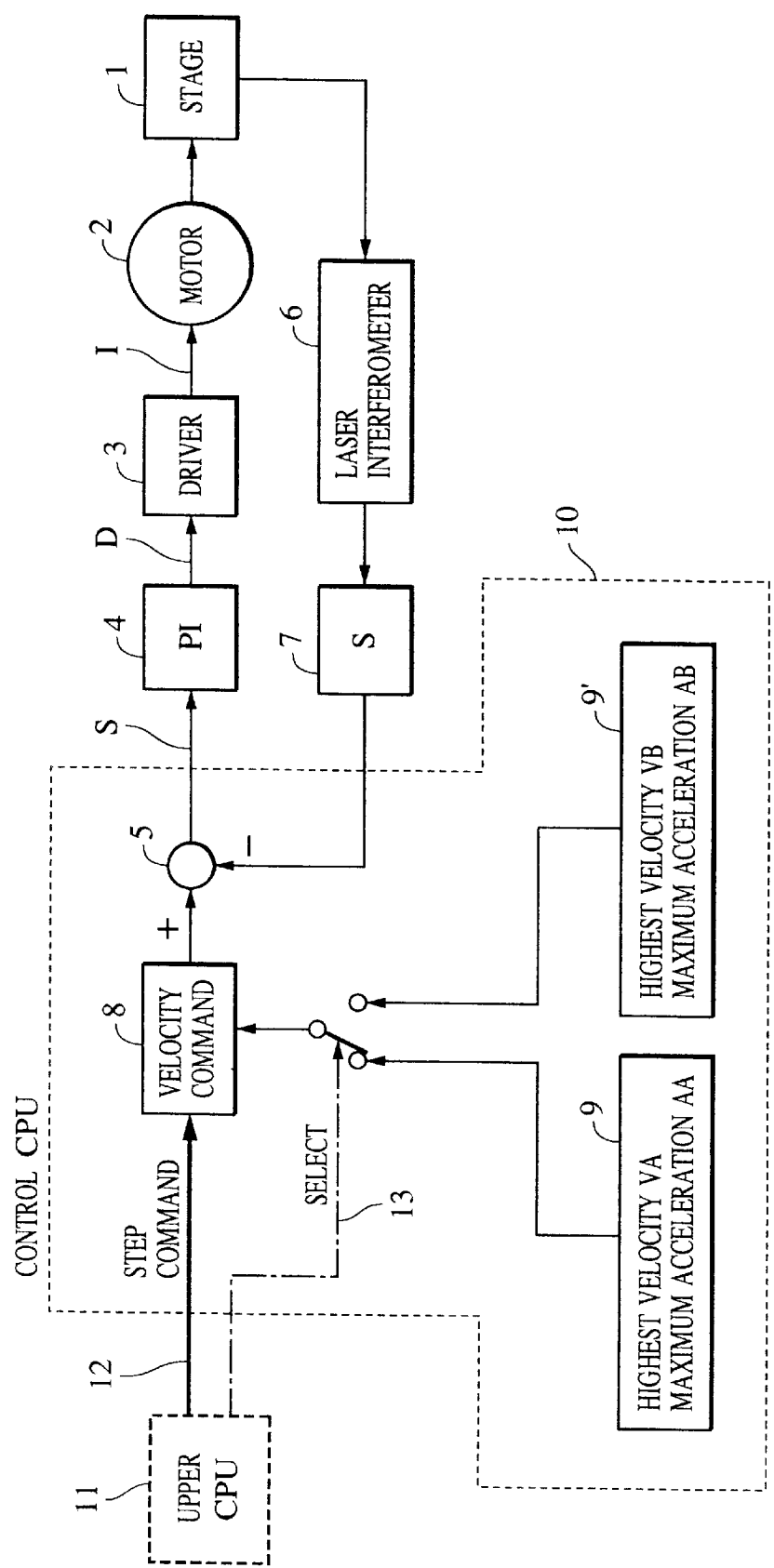
FIG. 1 is a block diagram showing the first embodiment of the present invention.

FIG. 1 is a block diagram of a wafer stage control unit of an exposure device according to the first embodiment of the present invention. FIG. 1 shows a block diagram in velocity control for a wafer stage. Referring to FIG. 1, reference numeral 1 denotes a wafer stage; 2, a motor for driving the wafer stage 1; 3, a driver for causing a current to flow into the motor 2; 4, a PI calculator; 5, a subtractor for calculating a deviation between a current position and a target position; 6, a laser interferometer for measuring the position of the wafer stage 1; 7, a differentiator for converting the position of the wafer stage 1 into a velocity; 8, a velocity command generator; 9, a highest velocity.maximum acceleration register in exposure and another movement (i.e., movement other than movement to measurement shots); 9', a highest velocity.maximum acceleration register in movement to measurement shots; 10, a stage control CPU such as a high-speed microprocessor or a DSP; 11, an upper CPU for giving a command to the stage control CPU 10; 12, a step command supplied from the upper CPU 11 to the stage control CPU 10; and 13, a selection signal, supplied from the upper CPU 11 to the stage control CPU 10, for selecting the highest velocity and the maximum acceleration.

A position P of the wafer stage 1 is measured by the laser interferometer 6 and converted into a velocity V by the differentiator 7. A deviation S between the velocity V and a velocity command generated by the velocity command generator 8 is calculated by the subtractor 5, and the deviation S is converted by the compensator (PI calculator) 4 into a command D to the driver 3. According to the command D, the driver 3 causes a current I to flow into the motor 2, thereby controlling the velocity of the stage 1.

Here, the velocity command generator 8 serving as a portion according to the characteristic feature of the present invention generates a velocity command on the basis of the value of the highest velocity.maximum acceleration register 9 or 9'.

Figure 3A:
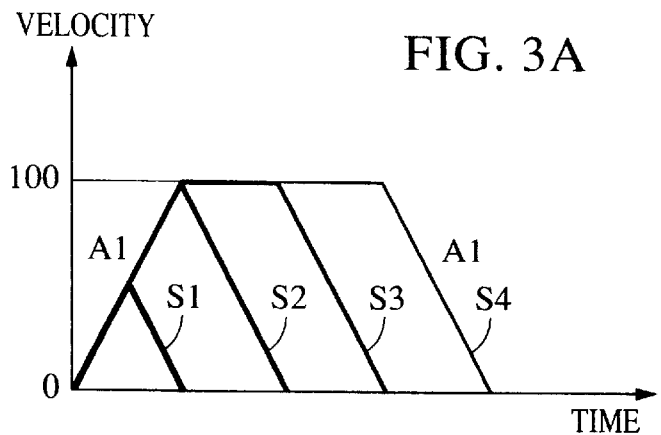
FIGS. 3A and 3B are graphs showing velocity patterns of a wafer stage in the first embodiment.

In movement to measurement shots, the upper CPU 11 gives the selection signal 13 for selecting the step command 12 and the highest velocity.maximum acceleration register 9' to the stage control CPU 10. At this time, the velocity command generator 8 of the upper CPU 11 generates a velocity pattern as shown in FIG. 3A on the basis of a step distance and a highest velocity VB and a maximum acceleration AB of the highest velocity.maximum acceleration register 9'. The stage 1 moves to a position near a target position according to the velocity command value. Thereafter, when positioning control is performed, and the completion of the positioning is confirmed, measurement of an alignment mark is started. More specifically, FIG. 3A shows a velocity pattern in movement to alignment measurement shots. In this case, highest velocity V1=100 mm/s, and maximum acceleration A1=1.0 mm/s².

Figure 3B:
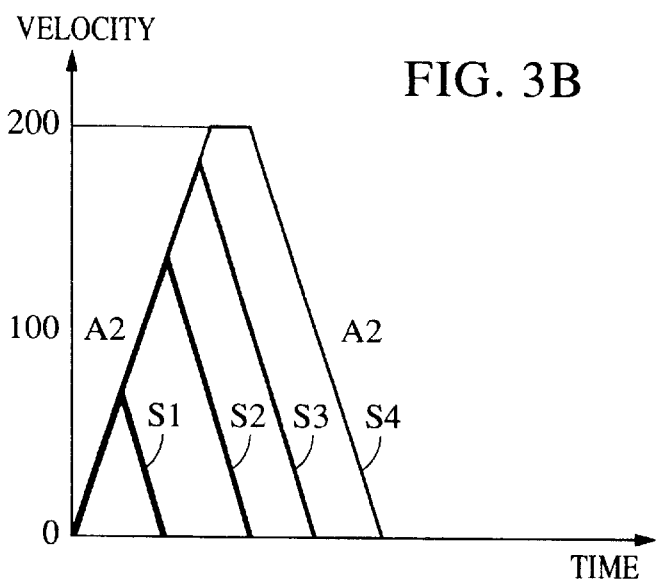

In exposure or another movement (i.e., a movement other than movement to measurement shots), the upper CPU 11 gives the selection signal 13 for selecting the step command 12 and the highest velocity.maximum acceleration register 9 to the stage control CPU 10. At this time, the velocity command generator 8 of the stage control CPU 10 generates a velocity pattern as shown in FIG. 3B on the basis of a step distance and a highest velocity VA and a maximum acceleration AA of the highest velocity.maximum acceleration register 9. The stage 1 moves to a position near a target position according to the velocity command value. Thereafter, when positioning control is performed, and the completion of the positioning is confirmed, exposure is started. More specifically, FIG. 3B shows a velocity pattern in movement to exposure shots. In this case, highest velocity V1=200 mm/s, and maximum acceleration A1=2.0 mm/s².

According to this embodiment, even if the highest velocity and the maximum acceleration in exposure or another movement are increased to increase throughput, the highest velocity and the maximum acceleration are set such that wafer stage precision is not degraded in alignment measurement shots which require high wafer stage precision. For this reason, the superposition precision of global alignment is not degraded.

In the first embodiment of the present invention, in a scanning exposure device having a global alignment function, the highest velocity and the maximum acceleration of the wafer stage are independently set in (1) movement to alignment measurement shots and (2) scanning exposure and movement other than movement to alignment measurement shots and scanning exposure.

In a second embodiment of the present invention, in a scanning exposure device having a global alignment function, the highest velocity and the maximum acceleration of the wafer stage are independently set in (1) movement to alignment measurement shots, in (2) scanning exposure, and in (3) another movement (i.e., a movement other than (a) movement to measurement shots and (b) scanning exposure).

Figure 2:
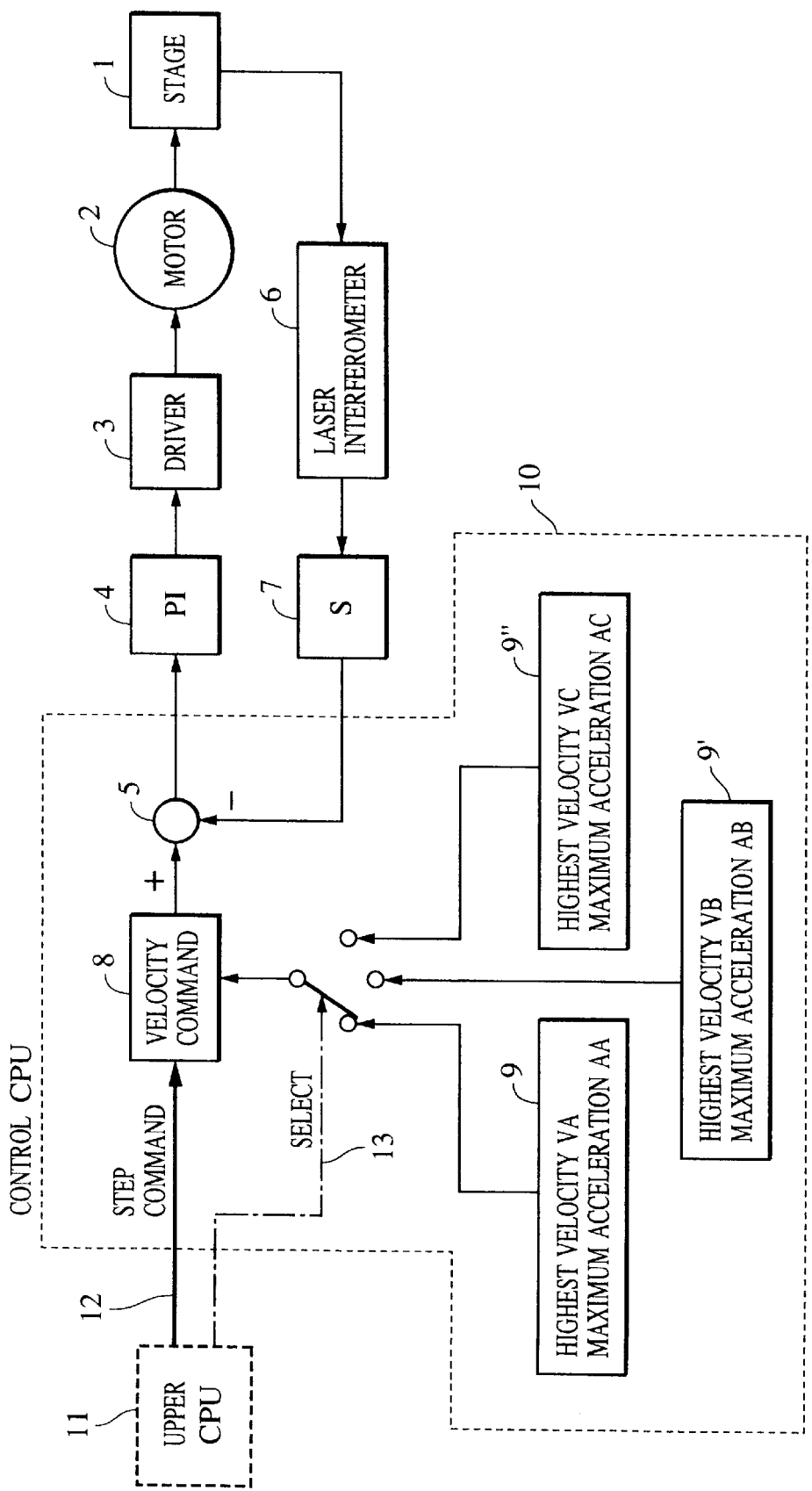
FIG. 2 is a block diagram showing the second embodiment of the present invention.
Figure 4:
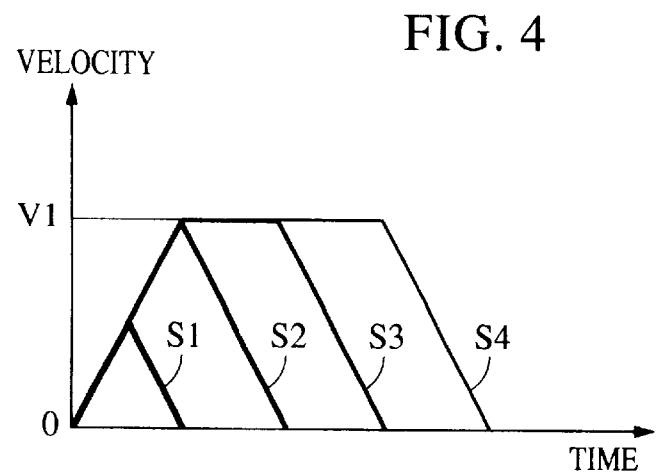
FIG. 4 is a graph showing a velocity pattern of a conventional wafer stage.
Figure 7:
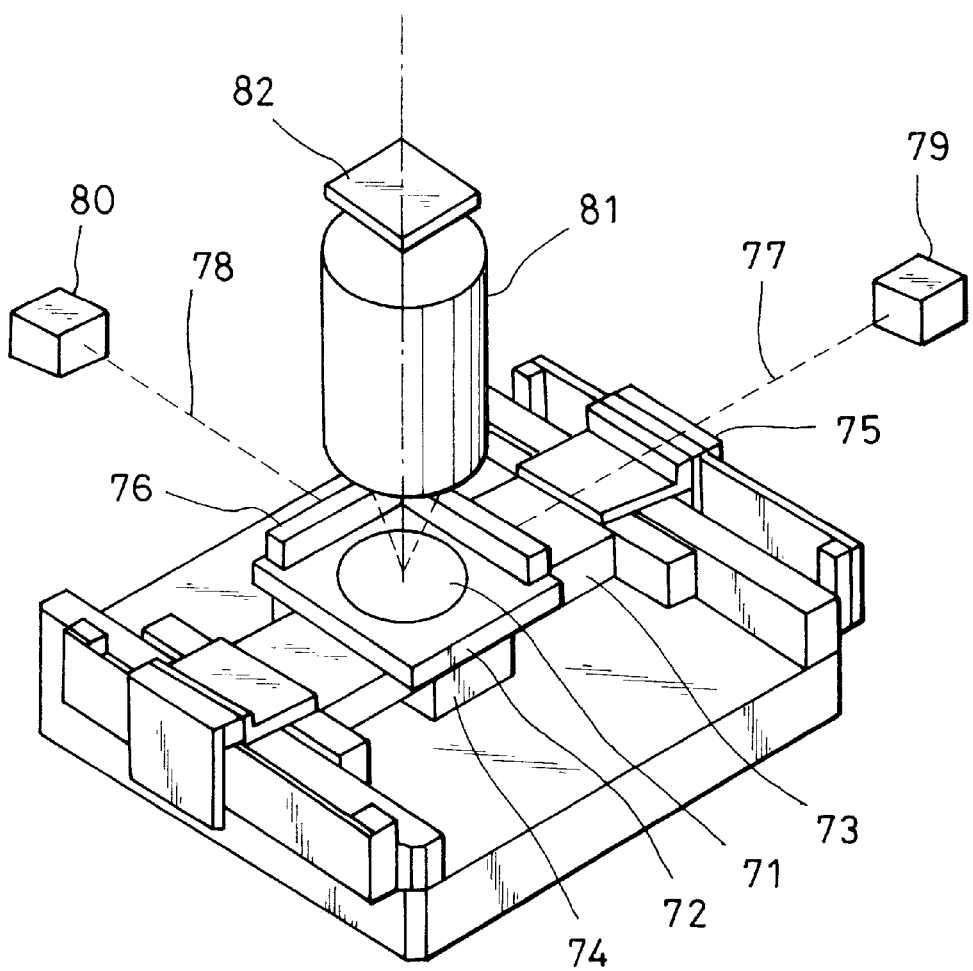
FIG. 7 is a view showing the outline arrangement of a stepper to which the present invention can be applied.

FIG. 2 is a block diagram of a wafer stage control unit of a scanning exposure device according to the second embodiment of the present invention. The second embodiment is almost the same as the first embodiment except for the following points. That is, reference numeral 9 denotes a highest velocity.maximum acceleration register in scanning exposure; 9', a highest velocity.maximum acceleration register in movement to measurement shots; and 9", a highest velocity.maximum acceleration register in another movement (i.e., movement other than (a) scanning exposure and (b) movement to measurement shots). The remaining reference numerals in FIG. 4 depict the same components as in FIG. 1. As can be seen from FIG. 4, the operation of the second embodiment is the same as that of the first embodiment, except that the upper CPU 11 gives the selection signal 13 for selecting between the highest velocity-.maximum acceleration registers 9, 9', and 9" in the respective cases of scanning (1) scanning exposure, (2) movement to measurement shots, and (3) movement other than (1) and (2).

In this embodiment, as in the first embodiment, in order to increase throughput, even if the highest velocity and the maximum acceleration of a wafer stage in movement other than scanning exposure and movement to measurement shots are increased, when the highest velocity and the maximum acceleration are set such that wafer stage precision is not degraded in alignment measurement shots which require high wafer stage precision, the superposition precision of global alignment is not degraded. In addition, the highest velocity and the maximum acceleration do not adversely affect velocity in scanning exposure.

Figure 8:
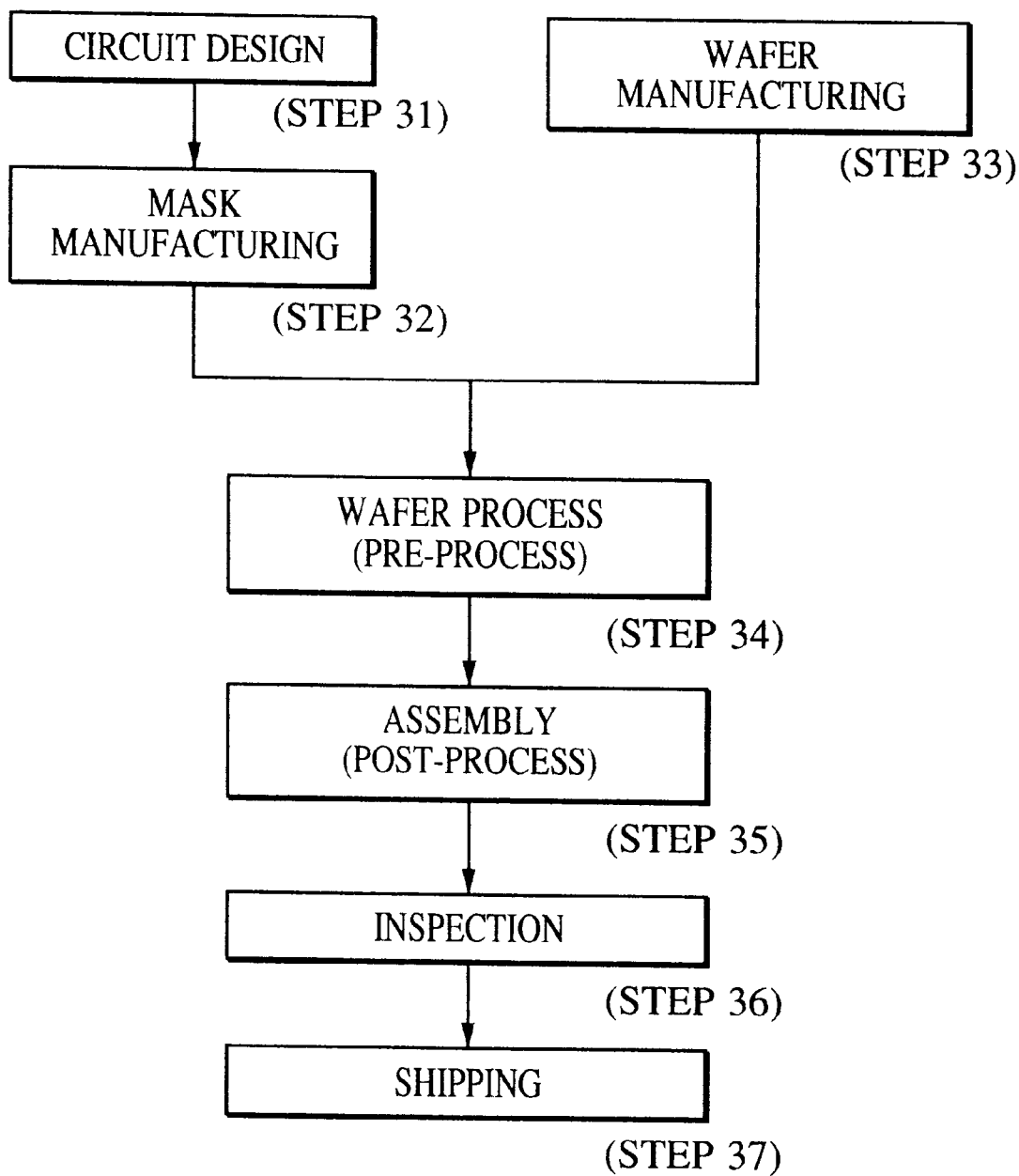
FIG. 8 is a flow chart showing the flow of manufacturing of a micro-device (e.g., a semiconductor device) which can be manufactured with the device shown in FIG. 1 or 2.

An example of device manufacturing which can use the exposure device according to the first or second embodiment will be described below. FIG. 8 shows the flow of manufacturing a micro-device (e.g., a semiconductor chip such as an IC or an LSI, a liquid-crystal panel, a CCD, a thin-film magnetic head, a micro-machine, and the like). In step 31 (circuit design), the circuit design of a semiconductor device is performed. In step 32 (mask manufacturing), a mask on which the designed circuit pattern is formed is manufactured. On the other hand, in step 33 (wafer manufacturing), a wafer is manufactured by using a material such as silicon. Step 34 (wafer process) is called a pre-process. In step 34, by using the prepared mask and wafer, an actual circuit is formed on the wafer by a lithography technique. The next step 35 (assembly) is called a post-process, and is the step of forming a semiconductor chip by using the wafer manufactured in step 34 and includes the steps such as the assembly step (dicing or bonding) and the packaging step (chip sealing). In step 36 (inspection), inspection, such as a performance test for the semiconductor device manufactured in step 35 and a durability test, is performed. The semiconductor device is completed through these steps. The semiconductor device is shipped (step 37).

Figure 9:
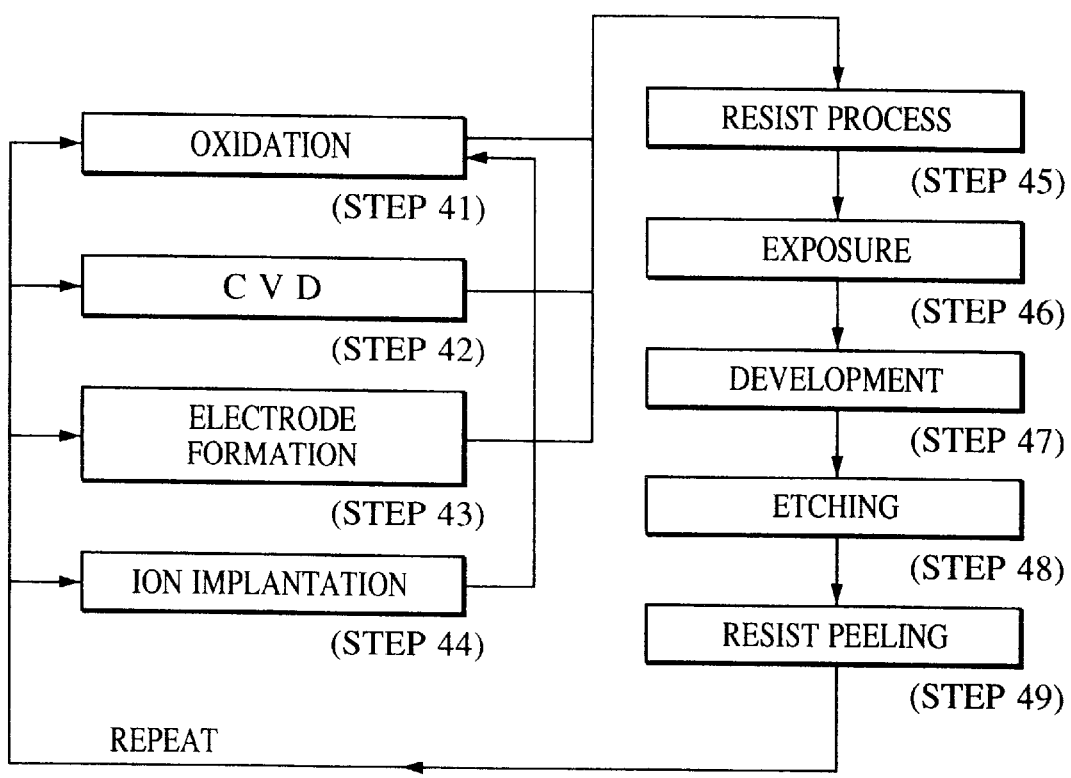
FIG. 9 is a flow chart showing the detailed flow of the wafer process in FIG. 8.

FIG. 9 shows the detailed flow of the wafer process described above (i.e., step 34). In step 41 (oxidation), the surface of a wafer is oxidized. In step 42 (CVD), an insulating film is formed on the wafer surface. In step 43 (electrode formation), electrodes are formed on the wafer by deposition. In step 44 (ion implantation), ions are implanted in the wafer. In step 45 (resist process), a photosensitive agent is coated on the wafer. In step 46 (exposure), the circuit pattern of a mask is printed and exposed by the exposure device described above. In step 47 (development), the exposed wafer is developed. In step 48 (etching), a portion other than the developed resist image is cut off. In step 49 (resist peeling), the resist which is unnecessary upon completion of the etching is removed. These steps are repeated to form a plurality of circuit patterns on the wafer.

By using the manufacturing method, a high-concentration semiconductor device which is not easily manufactured by the conventional technique can be manufactured at low cost.

As has been described above, according to the present invention, since a drive parameter can be set depending on the difference between the degrees of demand for positioning precision and throughput, the throughput can be increased without degrading the positioning precision. In particular, in an exposure device having a global alignment function and a scanning exposure device, the maximum throughput can be obtained without degrading superposition precision.

Except as otherwise disclosed herein, the various components shown in outline or in block form in the figures are individually well-known and their internal construction and operation are not critical either to the making or using of this invention or to a description of the best mode of the invention.

While the present invention has been described with respect to what is presently considered to be the preferred embodiments, it is to be understood that the invention is not limited to the disclosed embodiments. To the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. An exposure apparatus, having a global alignment function for measuring an alignment mark of alignment measurement shots, for performing exposure to a substrate on a substrate stage while moving and positioning the substrate stage, said apparatus comprising:

driving means for driving the substrate stage in accordance with a drive parameter; and computing means (a) for determining a next substrate stage movement to be executed during operation, (b) for automatically selecting the drive parameter based on the next substrate stage movement to be executed during operation, the drive parameter being automatically selected by said computing means from one of a first predetermined value and a second predetermined value, the first predetermined value being only and exclusively automatically selected by said computing means when the next substrate stage movement is a movement to an alignment measurement shot, and (c) for issuing the drive parameter to said driving means.

2. An apparatus according to claim 1, wherein the drive parameter is a parameter for controlling a highest velocity and a maximum acceleration of the substrate stage.

3. An apparatus according to claim 2, wherein the first predetermined value is lower than the second predetermined value.

4. An apparatus according to claim 2, wherein said exposure apparatus is a scanning exposure device, and the first predetermined value is a value different than the second predetermined value.

5. An exposure apparatus, having a global alignment function for measuring an alignment mark of alignment measurement shots, for performing exposure to a substrate on a substrate stage while moving and positioning the substrate stage, said apparatus comprising:

driving means for driving the substrate stage in accordance with a drive parameter; and computing means (a) for determining a next substrate stage movement to be executed during operation, (b) for automatically selecting the drive parameter based on the next substrate stage movement to be executed, the drive parameter being automatically selected by said computing means from one of a first predetermined value, a second predetermined value, and a third predetermined value, the first predetermined value being only and exclusively automatically selected by said computing means when the next substrate stage movement is a movement to an alignment measurement shot, the second predetermined value being only and exclusively automatically selected by said computing means when the next substrate stage movement is a movement for scanning exposure, and (c) for issuing the drive parameter to said driving means.

6. A device manufacturing method, having a global alignment function for measuring an alignment mark of alignment measurement shots, for performing exposure to a substrate on a substrate stage while moving and positioning the substrate stage, said method comprising the steps of:

driving the substrate stage in accordance with a drive parameter;

determining a next substrate stage movement to be executed during operation;

automatically selecting the drive parameter based on the next substrate stage movement to be executed during operation, the drive parameter being automatically selected from one of a first predetermined value and a second predetermined value, the first predetermined value being only and exclusively automatically selected when the next substrate stage movement is a movement to an alignment measurement shot; and issuing the drive parameter for use in said driving step.

7. A method according to claim 6, wherein the drive parameter is a parameter for controlling the highest velocity and the maximum acceleration of the substrate stage.

8. A device manufacturing method, having a global alignment function for measuring an alignment mark of alignment measurement shots, for performing exposure to a substrate on a substrate stage while moving and positioning the substrate stage, said method comprising the steps of:

driving the substrate stage in accordance with a drive parameter;

determining a next substrate stage movement to be executed during operation;

automatically selecting the drive parameter based on the next substrate stage movement to be executed during operation, the drive parameter being automatically selected from one of a first predetermined value, a second predetermined value, and a third predetermined value, the first predetermined value being only and exclusively automatically selected when the next substrate stage movement is a movement to an alignment measurement shot, the second predetermined value being only and exclusively automatically selected when the next substrate stage movement is a movement for scanning exposure; and issuing the drive parameter for use in said driving step.

9. A method according to claim 8, wherein the drive parameter is a parameter for controlling the maximum velocity and the maximum acceleration of the substrate stage.

10. An exposure apparatus, having a global alignment function for measuring an alignment mark of alignment measurement shots, for performing exposure to a substrate on a substrate stage while moving and positioning the substrate stage, said apparatus comprising:

computing means for determining a next substrate stage movement to be executed during operation; and a control circuit (a) for automatically selecting at least one of a maximum permitted stage velocity and a maximum permitted stage acceleration, each of the maximum permitted stage velocity and the maximum permitted stage acceleration being based on the next substrate stage movement to be executed, the at least one of the maximum permitted stage velocity and the maximum permitted stage acceleration being automatically selected by said computing means from one of first predetermined values, second predetermined values, and third predetermined values, the first predetermined values being only and exclusively automatically selected by said computing means when the next substrate stage movement is a movement to an alignment measurement shot, the second predetermined values being only and exclusively automatically selected by said computing means when the next substrate stage movement is a movement for scanning exposure, and (b) for issuing the drive parameter to said driving means.

11. An apparatus according to claim 10, wherein said control circuit controls driving of the substrate stage in accordance with both of the maximum permitted stage velocity and the maximum permitted stage acceleration.

12. An apparatus according to claim 10, wherein said exposure apparatus is a scanning exposure apparatus.

13. An apparatus according to claim 10, further comprising a laser interferometer for measuring a position of the substrate stage, wherein said control circuit controls driving of the substrate stage in accordance with both (a) at least one of the maximum permitted stage velocity and the maximum permitted stage acceleration and (b) the position of the substrate stage measured by said laser interferometer.

14. An apparatus according to claim 13, wherein said control circuit controls driving of the substrate stage in accordance with (a) the maximum permitted stage velocity, (b) the maximum permitted stage acceleration, and (c) the position of the substrate stage measured by said laser interferometer.

15. An apparatus according to claim 10, further comprising a laser interferometer for measuring a position of the substrate stage, wherein said control circuit comprises velocity calculating means for calculating a velocity of the substrate stage in accordance with the position of the substrate stage measured by said laser interferometer, and said control circuit controls driving of the substrate stage in accordance with both (a) at least one of the maximum permitted stage velocity and the maximum permitted stage acceleration and (b) the velocity of the substrate stage calculated by said velocity calculating means.

16. A substrate stage driving method, having a global alignment function for measuring an alignment mark of alignment measurement shots, for performing exposure to a substrate on a substrate stage while moving and positioning the substrate stage, said method comprising the steps of:

determining a next substrate stage movement to be executed during operation;

automatically selecting at least one of a maximum permitted stage velocity and a maximum permitted stage acceleration based on the next substrate stage movement to be executed during operation, the at least one of the maximum permitted stage velocity and the maximum permitted stage acceleration being automatically selected from one of first predetermined values, second predetermined values, and third predetermined values, the first predetermined values being only and exclusively automatically selected when the next substrate stage movement is a movement to an alignment measurement shot, the second predetermined values being only and exclusively automatically selected when the next substrate stage movement is a movement for scanning exposure; and controlling driving of the substrate stage in accordance with the at least one of the selected maximum permitted stage velocity and the selected maximum permitted stage acceleration.

17. A method according to claim 16, wherein said controlling step controls driving of the substrate stage in accordance with both of the maximum permitted stage velocity and the maximum permitted stage acceleration.

18. A method according to claim 16, further comprising a position measuring step for measuring a position of the substrate stage, wherein said controlling step controls driving of the substrate stage in accordance with both (a) at least one of the maximum permitted stage velocity and the maximum permitted stage acceleration and (b) the position of the substrate stage measured in said position measuring step.

19. A method according to claim 18, wherein said controlling step controls driving of the substrate stage in accordance with (a) the maximum permitted stage velocity, (b) the maximum permitted stage acceleration, and (c) the position of the substrate stage measured in said position measuring step.

20. An apparatus according to claim 1, further comprising setting means for setting the first predetermined value for movement to the alignment measurement shots and the second predetermined value for movement to exposure shots.

21. A method according to claim 7, further comprising the step of setting the first predetermined value for movement to the alignment measurement shots and the second predetermined value for movement to exposure shots.

22. A method according to claim 9, further comprising the step of setting the first predetermined value for movement to the alignment measurement shots and the second predetermined value for movement to exposure shots.

23. An apparatus according to claim 11, further comprising setting means for setting the first predetermined value for movement to the alignment measurement shots and the second predetermined value for movement to exposure shots.

24. A method according to claim 17, further comprising the step of setting the first predetermined value for movement to the alignment measurement shots and the second predetermined value for movement to exposure shots.

* * * * *

UNITED STATES PATENT AND TRADEMARK OFFICE
CERTIFICATE OF CORRECTION

PATENT NO. : 6,233,040 B1
DATED : May 15, 2001
INVENTOR(S) : Hiroyuki Sekiguchi

Page 1 of 1

It is certified that error appears in the above-identified patent and that said Letters Patent is hereby corrected as shown below:

Column 10,
Line 43, "claim 7" should read -- claim 6 --;
Line 47, "claim 9" should read -- claim 8 --;
Line 51, "claim 11" should read -- claim 10 --;
Line 56, "claim 17" should read -- claim 16 --;

Signed and Sealed this

Twenty-seventh Day of November, 2001

Attest:

*Nicholas P. Godici*

NICHOLAS P. GODICI
*Attesting Officer*   *Acting Director of the United States Patent and Trademark Office*